United States Patent
Reboh (10) Patent No.: US 11,942,323 B2
(45) Date of Patent: Mar. 26, 2024

(54) METHOD FOR MANUFACTURING A DOPED ZONE OF A MICROELECTRONIC DEVICE

(71) Applicant: COMMISSARIAT A L'ENERGIE ATOMIQUE ET AUX ENERGIES ALTERNATIVES, Paris (FR)

(72) Inventor: Shay Reboh, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 142 days.

(21) Appl. No.: 17/455,436

(22) Filed: Nov. 18, 2021

(65) Prior Publication Data
US 2022/0157608 A1    May 19, 2022

(30) Foreign Application Priority Data
Nov. 18, 2020 (FR) ..................... 20 11822

(51) Int. Cl.
*H01L 21/00* (2006.01)
*H01L 21/02* (2006.01)
*H01L 21/225* (2006.01)

(52) U.S. Cl.
CPC .... *H01L 21/2256* (2013.01); *H01L 21/02164* (2013.01); *H01L 21/2257* (2013.01)

(58) Field of Classification Search
CPC ........... H01L 21/2256; H01L 21/02164; H01L 21/2257
See application file for complete search history.

(56) References Cited

U.S. PATENT DOCUMENTS 9,991,129 B1 * 6/2018 Bajaj ................. H01L 21/32132
2008/0242037 A1   10/2008 Sell et al.
(Continued)

FOREIGN PATENT DOCUMENTS

EP   2 765 599 A1   8/2014
EP   2 835 832 A2   2/2015
EP   3 144 973 A1   3/2017

OTHER PUBLICATIONS

French Preliminary Search Report dated Jul. 8, 2021 in French Application 20 11822 filed on Nov. 18, 2020, 9 pages (with English Translation of Categories of Cited Documents & Written Opinion).

*Primary Examiner* — Richard A Booth
(74) *Attorney, Agent, or Firm* — Oblon, McClelland, Maier & Neustadt, L.L.P.

(57) ABSTRACT

A method for forming a doped zone of a transistor includes providing a stack having at least one active layer made from a semiconductor material, and a transistor gate pattern having at least one lateral side, and modifying a portion of the active layer so as to form a modified portion made of a modified semiconductor material. The modified portion extends down to the at least one lateral side of the gate pattern, at the edge of a non-modified portion above which the gate pattern is located. The method also includes forming a spacer on the lateral side, removing the modified portion by selective etching of the modified semiconductor material with respect to the semiconductor material of the non-modified portion, so as to expose an edge of the non-modified portion, and forming the doped zone by epitaxy starting from the exposed edge.

16 Claims, 4 Drawing Sheets

(56) References Cited

U.S. PATENT DOCUMENTS

| | | |
|---|---|---|
| 2014/0370668 A1 | 12/2014 | Niebojewski et al. |
| 2015/0044841 A1 | 2/2015 | Batude et al. |
| 2016/0042955 A1 | 2/2016 | Niebojewski et al. |
| 2017/0084720 A1 | 3/2017 | Pollet et al. |

* cited by examiner

METHOD FOR MANUFACTURING A DOPED ZONE OF A MICROELECTRONIC DEVICE

TECHNICAL FIELD

The present invention relates to the field of microelectronics. A particularly advantageous use of it is the creation of sources and drains in transistors requiring low thermal budgets, in particular in the field of monolithic 3D integration.

PRIOR ART

Historically, the developments of the semiconductor industry aim at following, through a common roadmap, Moore's law, which foresees the doubling of the density of electronic chips approximately every eighteen months. The technological nodes marking this roadmap are generally defined by the fineness of etching of the transistors of the integrated circuits.

For the technological nodes having an etching fineness of less than 10 nm, the developments required are extremely complex and costly. An alternative solution to the most advance technological nodes, relaxing a part of the constraints linked to the fineness of etching, involves integrating the transistors according to a three-dimensional (3D) architecture. This concept of 3D integration is a promising solution for globally improving the relative criteria of power/performance/bulk/cost of integrated circuits, according to a "More than Moore" approach while allowing a co-integration of various devices on various levels.

Among the 3D Very Large Scale Integration methods (or 3D VLSI), the CoolCube™ integration method proposes forming transistors on top of each other sequentially. One issue of this method relates to the management of the thermal budget during the formation of the upper layers of transistors. In order to preserve the optimal electric characteristics of the transistors of the lower layers of the stack, the rise in temperature during the various steps of the method must be limited as much as possible. In particular, the formation of doped zones on either side of the channel of the transistor, typically the source and drain zones of the transistor, conventionally requires a step of activation and/or of diffusion of the dopants, after ion implantation of doping species.

One conventional solution for the activation of the dopants in the context of planar technology involves carrying out high-temperature thermal annealing, typically at a temperature T>1000° C., after implantation of the dopants.

One existing solution for the activation of the dopants in the context of 3D integration technology involves amorphising a part of the semiconductor layer intended to form the source and drain zones, before or during the implantation of the dopants. After implantation of the dopants, the activation of the dopants is carried out during the recrystallisation in solid phase of the amorphous semiconductor layer. This step of recrystallisation/activation can be carried out at a lower temperature, typically at a temperature T<600° C.

Figure 1A:
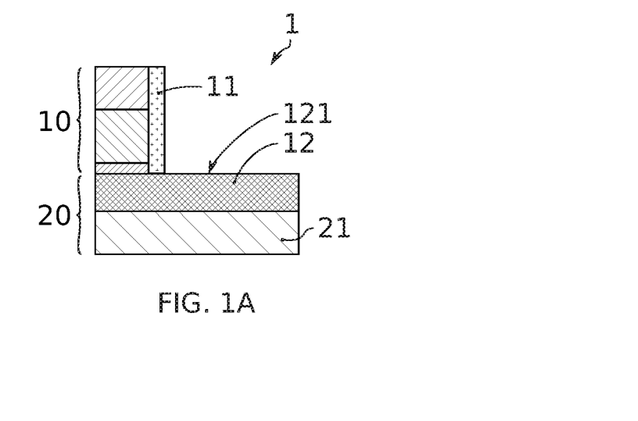
FIGS. 1A to 1C illustrate in a cross-section steps of forming a doped zone according to a method of the prior art.
Figure 1B:
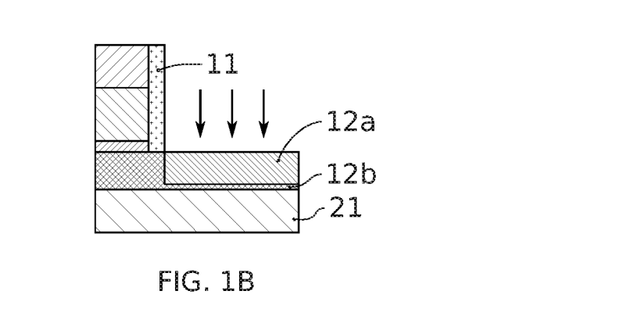
Figure 1C:
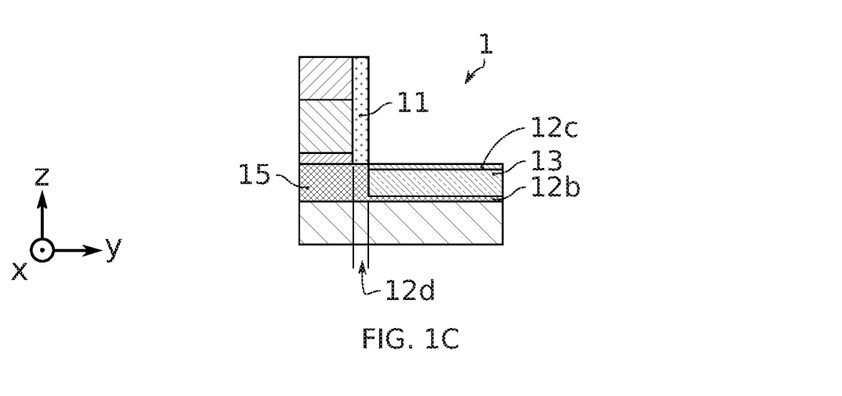

FIGS. 1A-1C present the steps of such a recrystallisation method called SPER (acronym for "solid-phase epitaxial regrowth"). FIG. 1A illustrates a device 1 intended to form a transistor and comprising a gate pattern 10 adjoined by a spacer 11 on a substrate 20 of the SOI type (acronym for "silicon on insulator"). The spacer 11 generally has dimensions ranging from 6 nm to 40 nm. FIG. 1B illustrates a bombardment of ions at the edge of the spacer 11, adapted to partially amorphise the upper layer of silicon 12 (topSi) of the SOI substrate, and to implant dopants in this amorphous part 12a. A crystalline part 12b of the topSi layer 12 is preserved after this bombardment, so as to form a seed for the future recrystallisation. FIG. 1C illustrates the partial recrystallisation of the topSi from this seed 12b. During the recrystallisation, the dopants are incorporated and activated. This recrystallisation allows in fine to obtain a doped zone 13.

One disadvantage of this solution based on the SPER recrystallisation method is that there is a non-doped zone 12d between the channel 15 and the doped zone 13, under the spacer 11. This non-doped zone 12d has a dimension according to the y axis substantially identical to that of the spacer 11. The presence of this non-doped zone 12d has the effect of increasing the access resistance of the transistor. Another disadvantage is the presence of the non-doped seed 12b underlying the doped zone 13. This further increases the access resistance of the transistor. Moreover, for small thicknesses of topSi, for example less than 10 nm, good control of the depth of amorphisation becomes essential. The implementation of the SPER method is therefore complex. Moreover, the recrystallisation of the amorphous part 12a of the topSi is generally not complete. A non-crystallised surface residual layer 12c remains, it is thus necessary to provide etching to eliminate it.

The documents EP 2835832 A2 and US 2008/0242037 A1 present alternative solutions for reducing the access resistance of the transistor, which are nevertheless not totally compatible with the 3D integration methods.

One object of the present invention is to at least partly overcome some of the disadvantages mentioned above.

In particular, one object of the present invention is to propose a method for forming a doped zone improving the access resistance of a microelectronic device.

The other objects, features and advantages of the present invention will appear upon examining the following description and the accompanying drawings. It is understood that other advantages can be incorporated.

SUMMARY

To reach this goal, a first aspect of the invention relates to a method for forming at least one doped zone intended to form one out of a source or a drain of a transistor, comprising the following steps:
  Providing a stack comprising at least one active layer made from a semiconductor material extending according to a basal plane, and a transistor gate pattern located above the active layer and having at least one lateral side extending in a plane substantially perpendicular to the active layer,
  Modifying a portion of the active layer along the entire thickness of the active layer so as to form a modified portion made of a modified semiconductor material, said modified portion extending directly at the edge of a non-modified portion of the active layer vertically in line with the gate pattern,
  Forming a spacer on said lateral side,
  Removing the modified portion by selective etching of the modified semiconductor material with respect to the semiconductor material of the non-modified portion, so as to expose an edge of said non-modified portion, said edge extending substantially in an extension of the lateral side of the gate pattern,
  Forming the doped zone by epitaxy starting from said exposed edge.

Thus the modification of the active layer is carried out so as to form a modified portion extending in at least one region of the active layer not overlaid by the gate pattern and extending down to the at least one lateral side of the gate pattern. As for the region of the active layer above which the gate pattern is located, it forms a non-modified portion. Thus, the interface between the modified portion and the non-modified portion is located vertically in line with the side of the gate pattern.

Advantageously, the modification of a portion of the active layer is carried out before the formation of the spacer. Therefore, no portion of the active layer is masked by the spacer during this modification. This allows to form a modified portion as close as possible to the gate pattern. Typically, for a modification carried out by implantation of species in the active layer according to a direction parallel to the side of the gate pattern, the interface between the modified portion and the non-modified portion vertically in line with the gate pattern extends substantially as an extension of the side, in the active layer. After removal of the modified portion, this interface forms the edge of the non-modified portion. The formation of the doped zone is carried out starting from this edge. The interface between the non-modified portion and the modified portion thus becomes a junction between the non-modified portion, typically the channel of the transistor, and the doped zone, typically the source or the drain of the transistor. This junction is preferably abrupt.

Such a method advantageously eliminates the residual non-doped zone that is located vertically in line with the spacer, between the channel and the doped zone, during the implementation of the known methods. The junction thus obtained allows to reduce the access resistance of the transistor. As indicated above in reference to FIG. 1B illustrating the prior art, a bombardment carried out in the context of the known solutions does not allow to make the non-doped zone disappear, even if this bombardment was modified so as to incline the direction of bombardment.

The formation of the doped zone by lateral epitaxy, that is to say starting from the edge of the non-modified portion, further allows to eliminate the need to preserve an epitaxy seed under the modified portion. Thus, the modification can be carried out over the entire thickness of the active layer, so that the modified portion has a thickness equal to that of the active layer, and afterwards, the doped zone has a thickness equal to that of the active layer. It is therefore not necessary to precisely control an implantation depth, contrary to the known methods. This allows to simplify the method. A doped zone extending according to the entire height of the active layer further allows to reduce the access resistance of the transistor.

Such a method can advantageously be implemented at low temperature, typically for temperatures T<600° C. This method is thus compatible with 3D integration technology.

BRIEF DESCRIPTION OF THE DRAWINGS

The goals, objects, as well as the features and advantages of the invention will be clearer from the detailed description of an embodiment of the latter that is illustrated by the following accompanying drawings in which.

The drawings are given as examples and are not limiting to the invention. They constitute diagrams of principles intended to facilitate the comprehension of the invention and are not necessarily on the scale of the practical uses. In particular, the relative dimensions of the various layers, portions and elements of the device (for example spacer, active layer, modified and non-modified portions) are not representative of the reality. In the drawings, a single side of the gate and a single spacer are shown. It is understood that the method is applied symmetrically to the second side of the gate and to the second spacer. Thus, the drawings can be extended by symmetry on either side of the z axis.

DETAILED DESCRIPTION

Before starting a detailed review of embodiments of the invention, optional features that can optionally be used in association or alternatively are stated below:

According to one example, the modification of the portion of active layer forming the modified portion is carried out according to the entire thickness of the active layer.

According to one example, the selectivity of the etching of the modified semiconductor material with respect to the semiconductor material is greater than or equal to 10:1, and preferably greater than or equal to 20:1.

According to one example, the formation of the spacer comprises at least one deposition of a dielectric layer at least on the gate pattern followed by partial etching of said dielectric layer so as to remove said dielectric layer outside of the at least one lateral side, and the removal of the modified portion is carried out by said partial etching.

According to one example, the method further comprises, after modification of the portion of the active layer and before formation of the spacer, a formation of a protective layer on an exposed face of the modified portion, said protective layer being removed after formation of the spacer and before removal of the modified portion.

According to one example, the modification of the portion of the active layer is carried out so that the modified portion is amorphous, said non-modified portion being crystalline.

According to one example, the modification of the portion of the active layer is carried out so that the modified semiconductor material has a chemical composition different from the semiconductor material.

According to one example, the modification of the portion of the active layer is carried out by implantation of species in the active layer, for example from a plasma.

According to one example, the semiconductor material of the active layer is taken from silicon and silicon-germanium.

According to one example, the doped zone contains silicon or silicon-germanium.

According to one example, the epitaxy of the doped zone is configured for said doped zone to extend beyond an upper face of the active layer according to a direction substantially perpendicular to said upper face of the active layer.

According to one example, the epitaxy of the doped zone is a lateral epitaxy mainly directed according to a direction parallel to the face of the active layer.

According to one example, the selective etching is anisotropic and mainly directed according to a direction perpendicular to the face of the active layer.

According to one example, the epitaxy of the doped zone is configured so as to form a cavity under the doped zone.

It is specified that in the context of the present invention, the terms "on", "is above", "covers" or "underlying" or their equivalents do not necessarily mean "in contact with". Thus for example the deposition of a first layer on a second layer does not necessarily means that the two layers are directly in contact with one another, but this means that the first layer at least partially covers the second layer while being either directly in contact with it or while being separated from it by at least one other layer or at least one other element.

Moreover, a layer can be composed of several sublayers of the same material or of different materials.

A substrate, a layer, a device, "containing" a material M means a substrate, a layer, a device comprising: only this material M or this material M and optionally other materials, for example alloying elements, impurities or doping elements. Thus, a spacer containing SiN silicon nitride can for example comprise non-stoichiometric silicon nitride (SiN), or stoichiometric silicon nitride (Si3N4), or a silicon oxynitride (SiON).

In general, but not in a limiting manner, a spacer forms a ring around the gate, with a closed contour; the description of a spacer preferably means this single spacer around the gate; however, the drawings for illustration in a cross-section, generally according to a plane transverse to the longitudinal direction of the gates, show two spacer parts on either side of the sides of the gate. By extension, these two spacer parts are often designated as "the spacers". The latter terminology can optionally be adopted in this application. Moreover, the invention extends to the embodiments in which at least two discontinuous spacers cover a gate pattern.

The present invention allows in particular the manufacturing of at least one transistor or of a plurality of transistors on a substrate. This substrate can be bulk or of the semiconductor on insulator type, for example an SOI silicon on insulator substrate or a GeOI germanium on insulator substrate.

The invention can also be implemented more broadly for various microelectronic devices or components.

Component, device or element of a microelectronic device means any type of element made with the means of microelectronics. These devices encompass in particular in addition to the devices with a purely electronic purpose micromechanical or electromechanical devices (MEMS, NEMS . . . ) as well as optical or optoelectronic devices (MOEMS . . . ).

Several embodiments of the invention implementing successive steps of the manufacturing method are described below. Unless expressly mentioned, the adjective "successive" does not necessarily mean, even if this is generally preferred, that the steps follow each other immediately, and intermediate steps can separate them. Moreover, the term "step" means the carrying out of a part of the method, and can designate a set of substeps.

The word "dielectric" qualifies a material, the electric conductivity of which is sufficiently low in the given use to be used as an insulator. In the present invention, a dielectric material preferably has a dielectric constant lower than 7. The spacers are typically formed from a dielectric material.

The modified semiconductor material is considered to be different from the semiconductor material.

The terms "gate pattern", "gate stack", "gate" are used as synonyms.

"Etching selective with respect to" or "etching having a selectivity with respect to" means etching configured to remove a material A or a layer A with respect to a material B or a layer B, and having a speed of etching of the material A greater than the speed of etching of the material B. The selectivity is the ratio of the speed of etching of the material A to the speed of etching of the material B.

In the present patent application, preferably thickness will be mentioned for a layer, height for a device (transistor or gate for example) and depth for a cavity or etching. The thickness is taken according to a direction normal to the main plane of extension of the layer, the height and the depth are taken according to a direction normal to the base plane of the substrate. The plane of main extension of the layer, and respectively the base plane of the substrate, is generally parallel to a lower face or an upper face of this layer, and respectively of this substrate.

In the present patent application, a preferably orthonormal reference frame formed by the axes x, y, z is shown in the accompanying drawings. The substrate, more precisely its lower face and/or its upper face, extend in the basal plane xy.

Hereinafter, the length is taken according to the direction carried by the axis x and the width is taken according to the direction carried by the axis y.

An element located "vertically in line with" another element means that these two elements are both located on the same line perpendicular to the basal plane, or on the same line oriented according to the z axis in the drawings. An element located "in an extension" of another element means that these two elements are both oriented according to the same direction or the same plane, and preferably one in a continuation of the other.

"Horizontal" means an orientation parallel to a plane xy. "Vertical" means an orientation parallel to the axis z.

The terms "substantially", "approximately" mean "plus or minus 10%" or, when this is an angular orientation, "plus or minus 10°". Thus, a direction substantially normal to a plane means a direction having an angle of 90*10° with respect to the plane.

The invention will now be described in detail through several non-limiting embodiments.

A first embodiment of the method is illustrated in FIGS. 2A-2G.

Figure 2A:
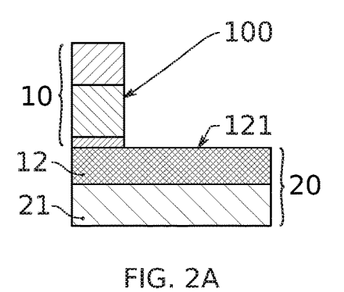
FIGS. 2A to 2G illustrate in a cross-section steps of forming a doped zone according to an embodiment of the present invention.

This method is preferably implemented on an initial structure comprising a gate pattern 10 and a substrate 20, as illustrated in FIG. 2A for example.

The substrate 20 can typically be a substrate of the semiconductor on insulator type, for example an SOI silicon on insulator substrate or a GeOI germanium on insulator substrate.

Such a substrate 20 of the SOI type typically comprises:
- a support made of bulk silicon typically having a thickness of several hundred μm (not illustrated) called bulk Si,
- a buried layer 21 made of silicon dioxide, called BOX (acronym for "Buried Oxide"). This layer 21 typically has a thickness between 30 nm and 200 nm, for example approximately 40 nm.
- an active layer 12 made of silicon, called top Si. This active layer 12 preferably has a thickness between 5 nm and 50 nm, for example approximately 10 nm.

Above the upper face 121 of the active layer 12 there is a gate stack or gate pattern 10. Conventionally, the gate pattern 10 can successively have the following layers disposed starting from the active layer 12: an interface oxide layer (often called gate oxide), a gate made of polycrystalline silicon called polySi and a hard mask. Alternatively, this gate pattern can comprise a layer with a high dielectric constant, called "high k" layer, above which there is a metal gate.

The gate pattern 10 typically has a height, according to z, of several tens of nanometres to several hundred nanometres.

In the rest of the description, and for reasons of conciseness, the gate pattern will be simply designated as gate 10. The invention also covers an alternative embodiment for which the gate pattern 10 is a sacrificial pattern intended to be removed after creation of the spacers, then to be replaced by another gate stack forming a gate 10. Such a method is routinely qualified as "gate last". Hereinafter, the gate 10 thus indifferently designates a gate stack of the "gate first" type (the gate is preserved after the creation of the spacers) or of the "gate last" type (the gate is replaced after the creation of the spacers).

The active layer is designated as topSi 12. The doped zone intended to form the source or the drain of the transistor is designated as S/D zone 13.

Figure 2B:
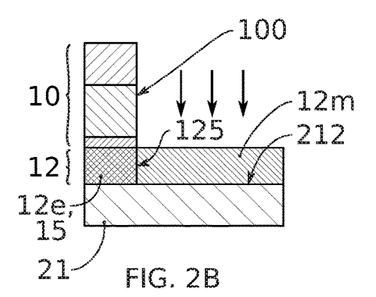

After structuring or providing of the gate 10 and before formation of the spacers 11 on the sides 100 of the gate 10, a portion 12m of the topSi 12, which is not masked, nor covered by the gate 10, nor by spacers, is modified (FIG. 2B). This modified portion 12m thus has an interface 125 with the non-modified portion 12e of topSi, which is covered by the gate 10. It is in the non-modified portion 12e that the channel 15 of the transistor will later be formed. The interface 125 between the modified portion 12m and the non-modified portion 12e is substantially parallel to z, in an extension of the side 100 of the gate 10. This allows to later align the junction between the channel and the S/D zone of the transistor directly at the edge of the gate 10. This prevents a non-doped portion from remaining between the channel 15 and the S/D zone formed later. The resistance of access to the transistor is thus reduced.

The modified portion 12m preferably has a thickness equal to the thickness of the active layer 12. This prevents a non-doped portion from remaining outside of the channel 15, under the S/D zone formed later. The resistance of access to the transistor is thus reduced. Such a modified portion 12m thus extends until the interface 212 with the BOX 21. It is therefore not necessary to precisely control the stopping in terms of depth of the modification. The control in terms of depth of the modification of the topSi is thus facilitated.

The modification of the topSi 12 is configured to create a difference between the properties of etching of the modified Si of the portion 12m and of the crystalline Si of the channel 15. This modification can be carried out by ion implantation or by plasma. The modification is preferably carried out anisotropically, according to a direction mainly directed according to z. This does not therefore modify the portion 12e masked by the gate 10, according to this direction z.

This modification can be structural. It can lead to a change of phase of the crystalline active layer 12 so as to create an amorphous modified portion 12m. This modification does not aim to powder the topSi 12.

It should be noted that after amorphisation of the topSi layer 12 and before removal of the modified portion 12m, any microelectronic step is preferably carried out at a temperature lower than the recrystallisation temperature of the modified layer 12m. For example, the layer deposited/etched after the amorphisation can be deposited/etched at a temperature lower than the recrystallisation temperature of the modified layer 12m. When the layer of topSi is made of silicon, the deposition/etching temperature can be less than 700° C., preferably less than 600° C. and ideally less than 500° C. to avoid the recrystallisation of the layer of amorphous silicon 12m. When the layer of topSi is made of germanium, the deposition/etching temperature can be less than 600° C., preferably less than 500° C. and ideally less than 400° C. to avoid the recrystallisation of the layer of amorphous germanium 12m.

Alternatively or in combination, this modification can be chemical. It can comprise an introduction of chemical species aiming to modify the properties of etching and/or the nature of the semiconductor material.

According to one possibility, this anisotropic modification is carried out by anisotropic implantation of ions on at least the entire thickness of the topSi 12.

This anisotropic modification can be carried out in an implanter or from a plasma.

According to one possibility, the anisotropic implantation can be carried out in a conventional implanter. The angle of implantation remains constant throughout the implantation. This inclination is parallel to the side 100 of the gate 10.

The species implanted can be for example silicon (Si), germanium (Ge), argon (Ar), oxygen (O) or nitrogen (N).

The implantation conditions can be determined by simulation using a tool of the SRIM (acronym for "Stopping and Range of Ions in Matter") or TRIM (acronym for "Transport of Ions in Matter") type.

After modification, the properties of etching of the modified portion 12m with respect to the non-modified portion 12e are preferably such that:

the modified semiconductor material has a higher etching speed than the non-modified semiconductor material, for a given etching chemistry, and/or the modified semiconductor material has a higher reactivity to one or more chemical reactants than the non-modified semiconductor material.

Figure 2C:
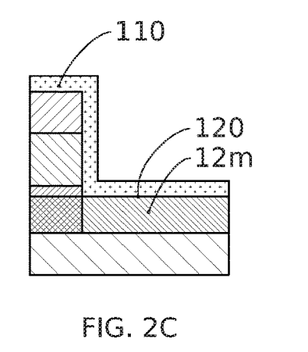

The spacer 11 is formed after modification of the topSi 12 and preferably before the removal of the modified portion 12m. The spacer 11 is typically formed by deposition of a layer 110 made of a dielectric material on the gate 10 and on the active layer 12, preferably conformally (FIG. 2C). A step of anisotropic etching according to z then allows to remove horizontal portions of said dielectric layer 110 at the top of the gate 10 and on a part of the active layer 12, while preserving a vertical portion of dielectric layer on the side 100 of the gate 10. This vertical portion forms the spacer 11. The dielectric layer can be made of SiN silicon nitride or made of SiCO (silicon carbon oxygen).

Figure 2D:
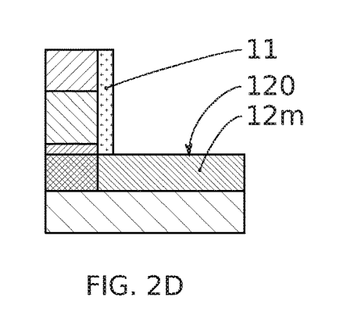

According to one embodiment, the anisotropic etching aiming to form the spacer 11 can be configured to stop at the upper face 120 of the modified portion 12m (FIG. 2D). The stopping of the etching on the upper face 120 of the modified portion 12m can be carried out by controlling the etching time, or by a detection of end of attack in a plasma reactor, or by resorting to an etching solution having sufficient selectivity, for example greater than 10:1, between the dielectric material and the modified semiconductor material of the modified portion 12m.

Figure 3B:
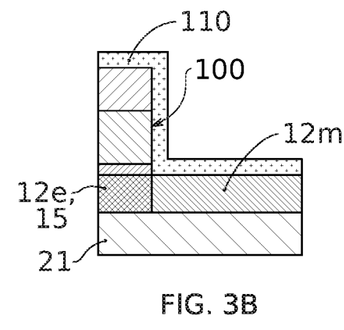
FIGS. 3B to 3E illustrate in a cross-section steps of forming a doped zone according to another embodiment of the present invention.
Figure 3C:
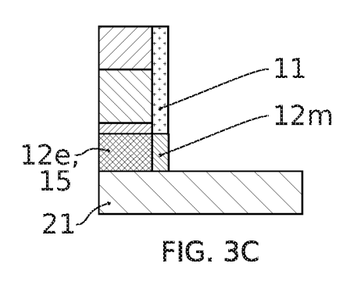
Figure 3D:
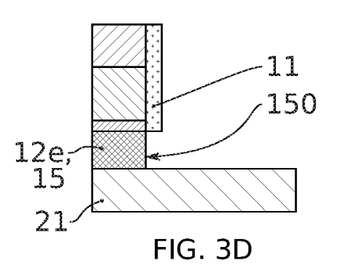

According to an alternative embodiment illustrated in FIGS. 3B-3E, the anisotropic etching aiming to form the spacer 11 can be configured to also etch the modified portion 12m (FIGS. 3B-3C) not masked by the spacer 11. According to this alternative embodiment, the etching solution preferably has little or no selectivity between the dielectric material and the modified semiconductor material. This allows to save a method step. In order to continue the etching of the modified portion 12m under the spacer 11, a step of isotropic and selective etching is preferably carried out. This isotropic and selective etching can have a selectivity greater than 10:1 between the modified semiconductor material and the semiconductor material. This allows to remove the modified portion 12m under the spacer 11 while preserving the non-modified portion 12e, as illustrated in FIG. 3D.

According to another example, the anisotropic etching aiming to form the spacer 11 is followed by anisotropic etching of the modified semiconductor material, for example the amorphous silicon. The latter etching is not necessarily selective with respect to the non-modified semiconductor material, for example the crystalline silicon. It is thus followed by isotropic and selective etching of the modified semiconductor material with respect to the non-modified semiconductor material, to remove the modified portion 12m under the spacer 11.

Figure 4B:
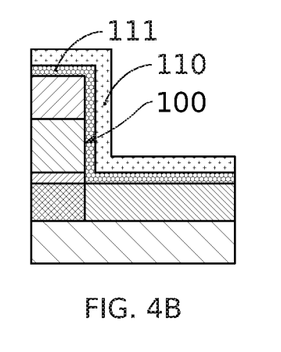
FIGS. 4B to 4F illustrate in a cross-section steps of forming a doped zone according to yet another embodiment of the present invention.
Figure 4C:
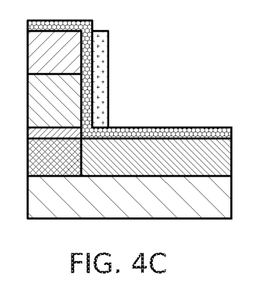
Figure 4D:
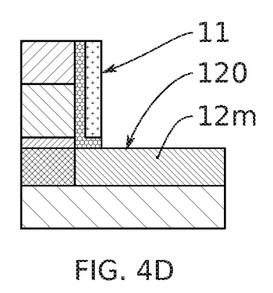

According to an alternative embodiment illustrated in FIGS. 4B-4F, a protective layer 111 several nanometres thick, for example between 1 nm and 3 nm, can be deposited before the deposition of the dielectric layer 110 (FIG. 4B). The spacer 11' is therefore formed in two stages. A first anisotropic etching directed according to z allows to remove horizontal portions of dielectric layer 110 while preserving a vertical portion of dielectric layer 110 (FIG. 4C). A second etching allows to remove horizontal portions of protective layer 111 while preserving a vertical portion of protective layer 111 (FIG. 4D). The protective layer 111 is used here to protect the modified portion 12m during the first anisotropic etching of the dielectric layer 110. The protective layer 110 can be made of silicon dioxide. The first etching can be carried out by plasma using fluorocarbon species. The second etching can be a wet etching using diluted HF. Such a second etching has sufficient selectivity with respect to the modified semiconductor material. This second etching can alternatively be carried out by RIE reactive ion etching.

Figure 2E:
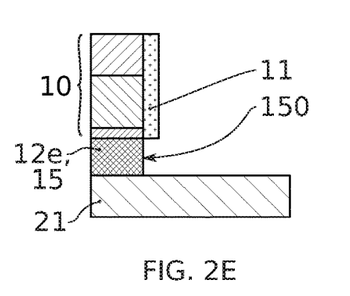
Figure 4E:
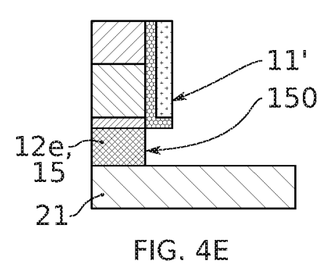

In all cases, the modified portion 12m is removed selectively to the non-modified portion 12e (FIGS. 2E, 3D, 4E). This removal is typically carried out by selective etching of the modified semiconductor material with respect to the non-modified semiconductor material. The etching selectivity can be greater than or equal to 5:1, and preferably greater than or equal to 10:1.

Methods for selective etching of amorphous Si and of alloys of Si with respect to crystalline Si, as described in the document "Low temperature catalyst enhanced etch process with high etch rate selectivity for amorphous silicon based alloys over single-crystalline silicon based alloys, M Bauer", or in the document "SELECTIVE ETCHING OF AMORPHOUS SILICON OVER EPITAXIAL SILICON, U.S. Pat. No. 9,991,129 B1", can be used to etch the modified portion 12m selectively to the non-modified portion 12e. This selective etching of amorphous Si can be carried out for example using a gaseous mixture containing atoms of chlorine. According to one example, the gaseous mixture contains hydrochloric acid. According to another example, the gaseous mixture contains hydrochloric acid, germane and optionally dihydrogen.

This selective etching allows to expose a side 150 of the non-modified portion 12e. This side 150 is substantially parallel to z, in an extension of the side 100 of the gate 10. This side 150 is advantageously used to form by lateral epitaxy, according to a direction substantially normal to the side 150, the doped zone 13. The side 150 therefore becomes an interface forming a junction between the channel 15 and the doped zone 13. This junction is advantageously located directly at the edge of the gate 10, vertically in line with the side 100. The resistance of access to the transistor can thus be reduced.

Figure 2F:
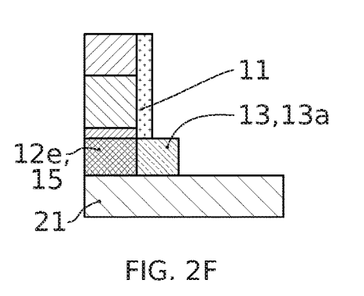
Figure 2G:
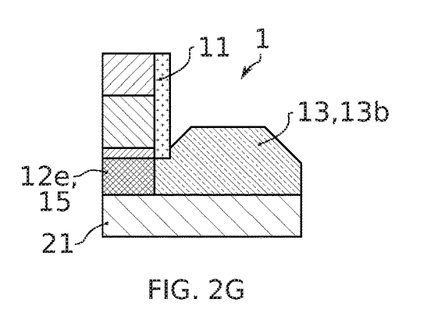
Figure 3E:
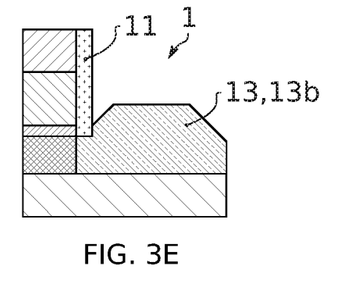
Figure 4F:
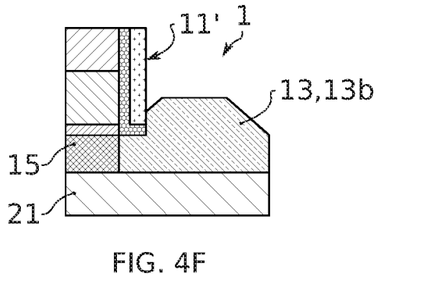

As illustrated in FIGS. 2F, 2G, the lateral epitaxy is carried out starting from the side 150, preferably only starting from the edge 150, first and mainly according to the axis y (portion 13a of the doped zone 13 in FIG. 2F). This epitaxy of the doped zone 13 can continue partly according to z (portion 13b of the doped zone 13 in FIGS. 2G, 3E, 4F). Such a configuration of a transistor 1 comprising raised S/D zones is called RSD, acronym for "Raised Source/Drain".

A method for in situ doped epitaxy is preferably implemented to form the doped zone 13. Boron (:B) or phosphorus (:P) doping can thus be obtained. The doped zone 13 can contain for example SiGe:B, Si:B or Si:P.

According to one possibility, a cavity is formed between the BOX 21 and the doped zone 13, 13b, during the lateral epitaxy. Such a cavity improves the electric insulation between the doped zone 13 and the substrate underlying the BOX 21.

According to one possibility, before the amorphisation of the layer of topSi 12, a fine layer of silicon oxide is deposited on the gate pattern 10, then etched (for example using HF chemistry) to form a fine layer of silicon oxide only on the sides 100 of the gate. This layer of silicon oxide has a width less than or equal to 3 nm, preferably less than or equal to 1 nm. Given the small width of this layer, the latter cannot be likened to a spacer which generally has a width of 6 nm to 40 nm, allowing it to insulate the gate. The role of this fine layer of silicon oxide is to avoid a phenomenon of "lateral straggling" during the amorphisation of the layer of topSi 12. In the present document, it is understood that the term "lateral side" corresponding to the reference 100 in the drawings can include this fine layer of silicon oxide. The gate pattern can thus comprise this fine layer of silicon oxide.

The invention is not limited to the embodiments described above and extends to all the embodiments that correspond to the spirit thereof.

The invention claimed is:

1. A method for forming at least one doped zone configured to form a source and/or a drain of a transistor, comprising:
providing a stack comprising at least one active layer made from a semiconductor material formed directly on an insulating layer, and a transistor gate pattern located above the at least one active layer and having at least one lateral side extending in a plane substantially perpendicular to a face of the at least one active layer, the at least one lateral side being exposed, then
modifying a portion of the at least one active layer along an entire thickness of the at least one active layer so as to form a modified portion made of a modified semiconductor material, the modified portion extending in a region of the at least one active layer not overlaid by the gate pattern and extending down to the at least one lateral side of the gate pattern, the region of the at least one active layer located under the gate pattern forming a non-modified portion, then
forming a spacer on the at least one lateral side of the gate pattern,
removing the modified portion by selective etching of the modified semiconductor material with respect to the semiconductor material of the non-modified portion, so as to expose an edge of the non-modified portion, the edge extending substantially in an extension of the at least one lateral side of the gate pattern, and to expose the insulating layer, and forming the doped zone by epitaxy starting from the exposed edge and extending over and in contact with the insulating layer.

2. The method according to claim 1, wherein the selectivity of the etching of the modified semiconductor material with respect to the semiconductor material is greater than or equal to 10:1.

3. The method according to claim 1, wherein forming the spacer comprises at least one deposition of a dielectric layer at least on the gate pattern followed by partial etching of the dielectric layer so as to remove the dielectric layer outside of the at least one lateral side, and wherein removing the modified portion is carried out by the partial etching.

4. The method according to claim 1, further comprising, after modifying the portion of the at least one active layer and before forming the spacer, forming a protective layer on an exposed face of the modified portion, the protective layer being removed after formation of the spacer and before removing the modified portion.

5. The method according to claim 1 wherein modifying the portion of the at least one active layer is carried out so that the modified portion is amorphous, the non-modified portion being crystalline.

6. The method according to claim 1, wherein modifying the portion of the at least one active layer is carried out so that the modified semiconductor material has a chemical composition different from the semiconductor material.

7. The method according to claim 6, wherein modifying the portion of the at least one active layer is carried out by implantation of species in the active layer.

8. The method according to claim 7, wherein the implantation of species in the active layer is carried out using a plasma.

9. The method according to claim 1, wherein the semiconductor material of the active layer is taken from silicon and silicon-germanium, and wherein the doped zone contains silicon or silicon-germanium.

10. The method according to claim 1, wherein the epitaxy of the doped zone is configured for the doped zone to extend beyond an upper face of the at least one active layer according to a direction substantially perpendicular to the upper face of the active layer.

11. The method according to claim 10, wherein the epitaxy of the doped zone is a lateral epitaxy mainly directed according to a direction parallel to the face of the at least one active layer.

12. The method according to claim 1, wherein the selective etching is anisotropic and mainly directed according to a direction perpendicular to the face of the at least one active layer.

13. The method according to claim 1, wherein the epitaxy of the doped zone is configured so as to form a cavity under the doped zone.

14. The method according to claim 1, wherein the selectivity of the etching of the modified semiconductor material with respect to the semiconductor material is greater than or equal to 20:1.

15. The method according to claim 10, wherein the epitaxy of the doped zone is a lateral epitaxy only directed according to a direction parallel to the face of the at least one active layer.

16. The method according to claim 1, comprising:
forming a film in contact with the lateral side and an upper surface of the modified portion; and
anisotropically etching the film to remove a portion of the film formed over the modified portion to expose the upper surface and continuing the anisotropic etching to remove a first portion of the modified portion to expose the insulating layer while leaving a remaining portion of the film on the lateral side to form the spacer and leaving a second portion of the modified portion under the remaining portion of the film; and
isotropically etching the second portion to expose the edge of the non-modified portion.

* * * * *